United States Patent [19]

Bonner et al.

[11] Patent Number: 4,904,995
[45] Date of Patent: Feb. 27, 1990

[54] INTEGRATED REMOTE ELECTRICITY METER TRANSPONDER AND COMBINATION

[75] Inventors: Mark N. Bonner, Yardley, Pa.; Ralph H. Carmen, Lebanon; Geoffrey F. Ringle, Trenton; Douglas W. Smith, Belle Mead; Izrail Tsals, Princeton Junction, all of N.J.; Thomas G. Moore, Jr., Kirkwood; Ronald K. Hamlin, St. Peters, both of Mo.

[73] Assignee: Emerson Electric Co., St. Louis, Mo.

[21] Appl. No.: 820,071

[22] Filed: Jan. 21, 1986

[51] Int. Cl.⁴ ............................................. G08C 9/06
[52] U.S. Cl. ....................... 340/870.02; 340/310 A; 340/310 R
[58] Field of Search .............. 340/870.02, 870.28, 340/310 A, 310 R, 825.54; 324/157; 179/2 AM; 346/14 MR; 361/364, 369, 370, 371

[56] References Cited

U.S. PATENT DOCUMENTS

| | | | |
|---|---|---|---|
| 3,717,118 | 2/1973 | Vanbennekom et al. | 324/156 |
| 3,729,727 | 4/1973 | Young et al. | 340/870.02 |
| 4,019,135 | 4/1977 | Löfdahl | 346/14 MR |
| 4,034,292 | 7/1977 | McClelland, III | 340/870.02 |
| 4,281,325 | 7/1981 | Jarva | 340/870.02 |
| 4,298,839 | 11/1981 | Johnston | 340/870.02 |
| 4,556,844 | 12/1985 | Wason | 340/870.02 |
| 4,584,527 | 4/1986 | Amigo | 340/870.02 |
| 4,638,314 | 1/1987 | Keller | 340/870.02 |

Primary Examiner—Gerald Brigance
Assistant Examiner—M. Fatahi-yar
Attorney, Agent, or Firm—Polster, Polster and Lucchesi

[57] ABSTRACT

A remote transponder unit is secured to the front of an electricity meter which, in turn, is electrically connected to an electric distribution system. The remote transponder unit is adjacent the power measuring disk of the electricity meter without obscuring the analog display of the meter. The transponder transmits data over the electric distribution system, including data representing the energy used by a user. The transponder unit includes a housing which is secured to the base of the meter and is electrically connected through the electricity meter through the electric distribution system.

2 Claims, 1 Drawing Sheet

INTEGRATED REMOTE ELECTRICITY METER TRANSPONDER AND COMBINATION

BACKGROUND OF THE INVENTION

This invention relates to carrier wave intelligence transmission systems in general and, more particularly, to apparatus useful in transmitting intelligence from electricity meters over electric power distribution networks to a central site.

The use of electric power lines for meter reading and other communications purposes is well known in the art. See U.S. Pat. Nos. 4,106,007, 4,218,655, and 4,400,688 to Johnston et al, and U.S. Pat. No. 4,105,897 to Stratton et al, which patents are incorporated herein by reference.

There is a growing recognition of the need for communication over feeders of electric power distribution networks. For example, automatic meter reading is attracting increased attention. Manual reading of electricity meters is highly labor-intensive and its costs are significant. When access to meters is impossible, billings are made on the basis of estimated readings, and such estimated billings often lead to customer complaints.

Unfortunately, the huge number of electricity meters currently in place are not suited for communications over electric distribution systems. Replacing such meters with meters which were capable of such communications could be extremely expensive. In addition, it is desirable that communicating electricity meters in the future still retain the capability of being read manually. In addition, space is often at a premium in the vicinity of electricity meters, so any transponder unit should be compact in construction. This presents another problem, however, since the electrical components of transponder units generate a quantity of heat which must be dissipated so that the components will not be damaged.

One of the objects of this invention is to provide an integrated remote electricity meter transponder which can be used in combination with existing electricity meters.

Another object of this invention is to provide such a transponder which eliminates special adaptation hardware or procedures.

Another object is to provide a transponder/electricity meter combination which is modular in construction so as to allow convenient replacement of disabled components as well as simple direct assembly.

Another object of this invention is to provide a transponder which mounts to existing structure on the electricity meter base.

Another object is to provide a transponder/electricity meter combination which can be visually read at a variety of angles.

Another object is to provide such a transponder which is compact in construction yet has adequate heat dissipation.

Other objects and features of this invention will be apparent to those skilled in the art in light of the following description and accompanying drawings.

SUMMARY OF THE INVENTION

In accordance with this invention, generally stated, an electricity meter for connection to an electric distribution system has a base on which meter components are mounted. The components include means for measuring the power from the electric distribution system used by a user and a display mounted on the front of the meter for visually displaying data representing the power used. A remote transponder unit is secured to the front of the meter adjacent the measuring means without obscuring the display and transmits data over the electric distribution system. This data includes data representing the power used by the user. The transponder unit includes a housing, means for securing the housing to the meter, means for obtaining information represented by the data from the measuring means, and means for connecting the remote transponder unit through the electricity meter to the electric distribution system.

In a second aspect of the present invention, a kit for modifying an electricity meter to transmit information over an electric distribution system includes a mounting sleeve, a remote transponder unit, and a protective cover. The remote transponder unit transmits data over an electric distribution system, which data represents power consumed. The transponder unit is mountable inside the mounting sleeve adjacent the face of the electricity meter. At least one of the mounting sleeve and transponder unit includes means for securing the transponder unit to the electricity meter. The protective cover is mountable to the electricity meter and is of sufficient size to cover and protect the mounting sleeve and the transponder unit.

DESCRIPTION OF THE PREFERRED EMBODIMENT

Figure 1:
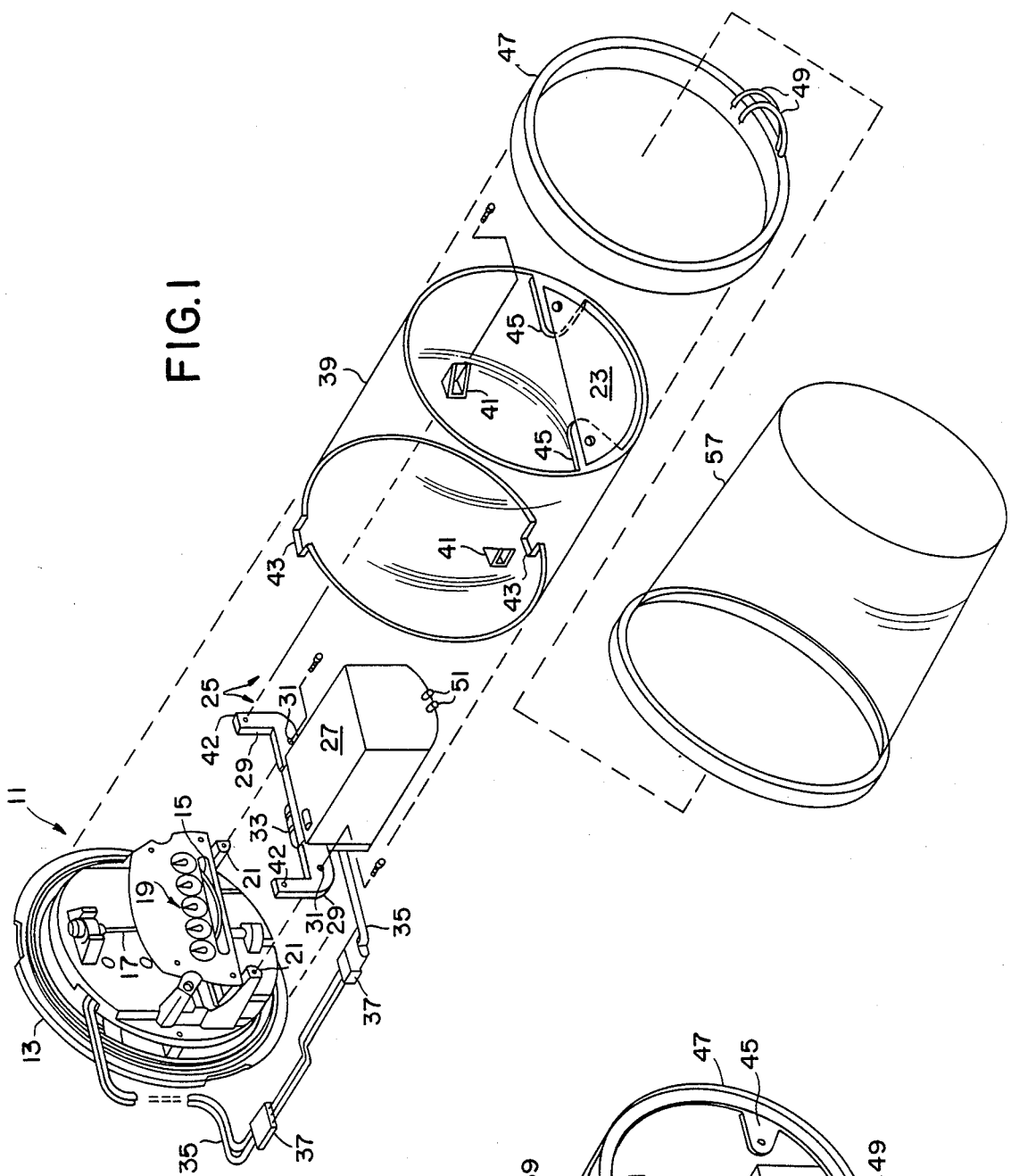
FIG. 1 is an exploded perspective of the electricity meter and transponder unit combination of the present invention.

Turning now to the drawings (FIG. 1), an electricity meter 11 includes a cast metal base 13 by means of which it is mounted to a wall or other suitable structure. Meter 11 includes a disk 15 which rotates about a shaft 17 in proportion to the amount of power being consumed by the user. Meter 11 also includes an analog display 19 for visually displaying to the meter reader the amount of power consumed. A pair of posts 21 are disposed immediately below analog display 19 for the suitable attachment of an identification plate 23 to meter 11. Meter 11 is thus seen to be conventional in all respects.

A remote transponding unit 25, having components such as disclosed in the aforementioned U.S. patents, is also shown in FIG. 1. Most of the components of remote transponder unit 25 are contained in a housing 27. At the distal end of housing 27 (that end of the housing adjacent meter 11), a pair of arms 29 extend outwardly and upwardly from the housing to provide a structure for mounting the housing to the electricity meter. Each arm 29 includes a hole 31, the space beween holes 31 being such that the housing can be suitably mounted to mounting posts 21 of the electricity meter. Also at the distal end of housing 27 is a pulse initiator 33 situated adjacent disk 15 so that it can read the rotation of the meter disk and thus obtain the data for transmission over the electric distribution system. Housing 27 is designed to shade the electronics components therein from outside light sources, and shield these same components to limit radio frequency emissions. A power cord 35 with an intermediate connector 37 is provided for supplying power to the remote transponder unit from the electricity meter and for supplying the information signal from the remote transponding unit back through the electricity meter to the electric distribution system in the manner disclosed in the aforementioned U.S. patents.

A clear polycarbonate sleeve 39 is also provided for mounting remote transponder unit 25. Since sleeve 39 is clear, it permits visual readings from a variety of angles. A pair of mounting lugs 41 are molded into the side of sleeve 39 and provide convenient attachment points for arms 29 of housing 27. Sleeve 39 also includes a pair 43 of protruding tabs at the distal end thereof which are designed to mate with corresponding structure on electricity meter base 13 to provide additional stabilization. Arms 29 of housing 27 include a second pair of holes 42 in registry with mounting lugs 41 to allow the mounting sleeve and the arms of housing 27 to be suitably secured together. A pair of ears 45 are molded integrally with sleeve 39 for providing attachment points for identification plate 23.

It has been found that remote transponder units 25 require an inductive load. Accordingly, remote transponding unit 25 includes an inductor ring 47 electrically connectable to the components inside housing 27 by means of a pair of wires 49 electrically connected to inductor ring 47 and by a pair of terminals 51 disposed on the proximal end of housing 27 and extending therethrough.

A conventional clear polycarbonate protective cover 57 is also provided to cover and protect both meter 11 and remote transponder unit 25.

Figure 2:
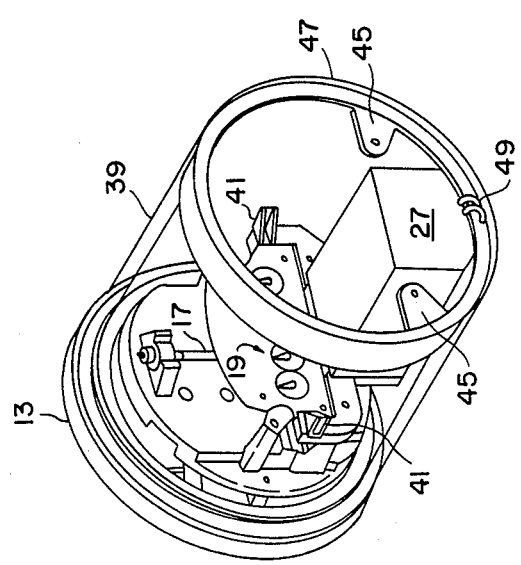
FIG. 2 is a perspective of the combination of the present invention, with parts removed for clarity.

Turning to FIG. 2, sleeve 39 and housing 27 are shown mounted to electricity meter base 13. Sleeve 39 encircles housing 27 and provides support for the housing. Inductor ring 47 slides over the proximal end of sleeve 39, and an electrical connection is made as described above between inductor ring 47 and the interior components of the housing. After the combination is assembled as shown in FIG. 2, protective cover 57 can be placed over sleeve 39. Placement of inductor ring 47 as shown in FIG. 2 allows the heat generated by the ring to dissipate through exterior cover 57 with minimal impact on the functional reliability of the electronics inside housing 27. Note, as well, that housing 27 is suspended from cast metal base 13 below analog display 19 to provide line-of-sight access for on-site readings.

The kit for modifying existing electricity meters is thus seen to include housing 27, sleeve 39, inductor ring 47, and protective cover 57. This kit is modular in construction which allows convenient replacement of disabled components as well as simple, direct assembly of the combination.

In view of the above, it will be seen that the various objects and features of the present invention are achieved and other advantageous results attained. It will be apparent to those skilled in the art that numerous modifications can be made to the apparatus shown herein without departing from the scope of the invention, as defined in the appended claims.

What is claimed is:

1. In combination, an electricity meter for connection to an electric distribution system having a base on which meter components are mounted, said components including means for measuring the energy from the electric distribution system used by a user and a display mounted on the front of the meter for visually displaying data representing the energy used, remote transponder means secured to the front of the meter adjacent the measuring means without obscuring the display for transmitting data over the electric distribution system, said transponder means extending substantially outwardly from the front of the meter, said data including data representing the energy used by a user, said transponder means including a closed housing extending substantially outwardly from the front of the meter, means for securing the housing to the meter without obscuring the meter display, means for obtaining information represented by the data from the measuring means, means for electrically connecting the remote transponder means through the electricity meter to the electric distribution system, a sleeve secured to the meter base which encircles and supports the transponder housing, a generally annular inductor mounted at the end of the sleeve opposite the meter face and means for electrically connecting the inductor to the transponder circuitry, said inductor being a heat source and being held separate from the transponder circuitry by the sleeve.

2. A kit for modifying an electricity meter to transmit information over an electric distribution system comprising:
   a mounting sleeve;
   remote transponder means for transmitting data over an electric distribution system, said data representing energy consumed, said transponder means including a closed housing and being mountable inside the mounting sleeve adjacent the face of the electricity meter;
   a pair of arms extending from the closed housing of the transponder means, said arms being securable to the meter to secure the transponder means to the electricity meter;
   said sleeve being securable to the meter base and to the pair of arms, said sleeve encircling and supporting said transponder means;
   a protective cover mountable to said electricity meter, said cover being of sufficient size to cover and protect the mounting sleeve and the transponder means; and
   a generally annular inductor mountable on the sleeve at the proximal end thereof and being electrically connectable to the transponder circuitry, said inductor being a heat source and being held separate from the transponder circuitry by the sleeve.

* * * * *